(12) United States Patent
Diem

(10) Patent No.: US 9,187,320 B2
(45) Date of Patent: Nov. 17, 2015

(54) METHOD FOR ETCHING A COMPLEX PATTERN

(71) Applicant: COMMISSARIAT A L'ENERGIE ATOMIQUE ET AUX ENE ALT, Paris (FR)

(72) Inventor: Bernard Diem, Echirolles (FR)

(73) Assignee: Commissariat à l'énergie atomique et aux énergies alternatives, Paris (FR)

( * ) Notice: Subject to any disclaimer, the term of this patent is extended or adjusted under 35 U.S.C. 154(b) by 0 days.

(21) Appl. No.: 14/370,529

(22) PCT Filed: Jan. 3, 2013

(86) PCT No.: PCT/EP2013/050040
§ 371 (c)(1),
(2) Date: Jul. 3, 2014

(87) PCT Pub. No.: WO2013/102637
PCT Pub. Date: Jul. 11, 2013

(65) Prior Publication Data
US 2014/0342557 A1    Nov. 20, 2014

(30) Foreign Application Priority Data

Jan. 5, 2012 (FR) ...................... 12 50098

(51) Int. Cl.
*H01L 21/302* (2006.01)
*B81C 1/00* (2006.01)
*H01L 21/308* (2006.01)

(52) U.S. Cl.
CPC ......... *B81C 1/00619* (2013.01); *B81C 1/00103* (2013.01); *B81C 1/00531* (2013.01);

(Continued)

(58) Field of Classification Search
CPC ................. B81C 1/00103; B81B 2203/033; B81B 2203/0392
USPC ........... 438/50, 311–313, 322, 401, 462, 975, 438/689
See application file for complete search history.

(56) References Cited

U.S. PATENT DOCUMENTS 5,316,618 A    5/1994   Van Lintel
7,229,745 B2 *  6/2007   Lamarre ...................... 430/313

(Continued)

FOREIGN PATENT DOCUMENTS

CN    1177021 A     3/1998
DE    199 26 769    12/2000

(Continued)

OTHER PUBLICATIONS

International Search Report issued Apr. 23, 2013 in PCT/EP13/050040 filed Jan. 3, 2013.

(Continued)

*Primary Examiner* — Lan Vinh
*Assistant Examiner* — Maki Angadi
(74) *Attorney, Agent, or Firm* — Oblon, McClelland, Maier & Neustadt, L.L.P.

(57) ABSTRACT

A method for etching a desired complex pattern in a first face of a substrate, including: simultaneous etching of at least a first and a second sub-pattern through the first face of the substrate, the etched sub-patterns being separated by at least one separating wall, a width of the first sub-pattern being greater than a width of the second sub-pattern at the first face, and a depth of the first sub-pattern being greater than a depth of the second sub-pattern in a direction perpendicular to the said first face; and removing or eliminating the separating wall to expose the desired complex pattern.

16 Claims, 11 Drawing Sheets

(52) U.S. Cl.
CPC ........ *B81C1/00539* (2013.01); *H01L 21/3083* (2013.01); *B81B 2203/033* (2013.01); *B81B 2203/0392* (2013.01); *B81C 2201/014* (2013.01); *B81C 2201/0132* (2013.01); *B81C 2201/0133* (2013.01)

(56) References Cited

U.S. PATENT DOCUMENTS

| | | | |
|---|---|---|---|
| 7,307,025 | B1* | 12/2007 | Worsham et al. ............. 438/711 |
| 8,647,945 | B2* | 2/2014 | Wang et al. .................. 438/248 |
| 2003/0139014 | A1 | 7/2003 | Najafi et al. |
| 2004/0097001 | A1 | 5/2004 | Hsieh et al. |
| 2005/0224449 | A1 | 10/2005 | Hsieh et al. |
| 2012/0279299 | A1 | 11/2012 | Walther et al. |
| 2014/0342557 | A1 | 11/2014 | Diem |
| 2015/0028433 | A1 | 1/2015 | Baillin et al. |

FOREIGN PATENT DOCUMENTS

| | | |
|---|---|---|
| JP | 2009/269120 A | 11/2009 |
| WO | 91 14281 | 9/1991 |

OTHER PUBLICATIONS

French Search Report issued Dec. 3, 2012 in French Application FR 12 50098 filed Jan. 5, 2012.

Wu et al., "High aspect ratio silicon etch: A review", Journal of Applied Physics, American Institute of Physics, vol. 108, No. 5, pp. 051101-1 to 051101-20 (2010), XP012142732.

U.S. Appl. No. 14/661,430.

French Preliminary Search Report issued Dec. 5, 2012 in Patent Application No. FR 1250098 (with English Translation of Category of Cited Documents).

C. Gui, et al., "Fabrication of multi-layer substrates for high aspect ratio single crystalline microstructures" Sensors and Actuators, A 70, 1998, pp. 61-66.

Kenneth E. Bean, "Anisotropic Etching of Silicon" IEEE Transactions on Electron Devices, vol. ED-25, No. 10, Oct. 1978, pp. 1185-1193.

Jani Karttunen, et al., "Loading effects in deep silicon etching" Proceedings of SPIE 2000, vol. 4174, 2000, pp. 90-97.

Svetlana Tatic-Lucic, et al., "Etch-stop characteristics of heavily B/Ge-doped silicon epilayer in KOH and TMAH" Sensors and Actuators, A 123-124, 2005, pp. 640-645.

Y.C. Yuan, et al., "Self healing in polymers and polymer composites. Concepts, realization and outlook: A review" Express Polymer Letters, vol. 2, No. 4, 2008, pp. 238-250.

Office Action issued Aug. 5, 2015 in European Patent Application No. 13 700 005.5.

Chinese Office Action dated Jul. 3, 2015 in corresponding CN Application 2013/800049187 (with English translation).

* cited by examiner

METHOD FOR ETCHING A COMPLEX PATTERN

TECHNICAL FIELD

The present invention concerns the technical field of microelectronics, and more particularly microsystems of MEMS or MOEMS type having a three-dimensional or complex pattern.

STATE OF THE PRIOR ART

In microelectronics the producing of microsystems requires at least one etching step of at least part of their substrate to define the geometry thereof. At this step the use of a mask allows the easy, rapid formation of two-dimensional patterns on the surface of a substrate. The techniques frequently used are chiefly etching techniques via wet process (chemical or electrochemical), or dry process (e.g. plasma etching). On the other hand, there is still no technique available that is as simple and rapid for producing three-dimensional patterns i.e. comprising at least two different depth levels in the substrate. This type of pattern is also called a complex pattern, reflecting the difficulties encountered to obtain these patterns.

One known technique currently allows the etching of complex patterns in substrates having several layers of different materials, which acts on their respective etching speed. This type of particular substrate is formed by alternating layers through some of which the patterns pass, the shape of the patterns being dependent on their depth level in the said substrate. In this manner a complex pattern can be produced having several depth levels as a function of the materials used and their position in the substrate (C. Gui et al., *Fabrication of multi-layer substrates for high aspect ratio single crystalline microstructures*, Sensors and Actuators, A70 (1998) 61-66); Svetlana Tatic-Lucic et al., *Etch-stop characteristics of heavily B/Ge-doped silicon epilayer in KOH and TMAH*, Sensors and Actuators, A 123-124 (2005) 640-645). The depth of the complex pattern, for this type of substrate, is therefore determined before the etching step. On this account, the position of the layers composing the substrate must be previously defined in relation to the complex pattern it is desired to etch. A substrate having buried layers can therefore only be used to form one type of complex pattern. This technique is therefore time-consuming, uses costly materials and is complex to carry out.

Another known etching technique to form complex patterns uses a chemical agent reacting in contact with a single-crystalline substrate. The etching speed of the chemical agent in this case is dependent on the orientation of the crystallization planes. The shapes of the complex patterns which can be produced are therefore strongly limited by the state and orientation of the crystallization planes (Kenneth E. Bean, *Anisotropic Etching of Silicon*, IEEE Transactions on Electron Devices, Vol. ED-25, No 10, October 1978).

It is one of the objectives of the invention to be able to obtain the rapid, simple forming of different complex shapes from a homogeneous or heterogeneous substrate.

DESCRIPTION OF THE INVENTION

The invention concerns a method for etching a desired complex pattern, in a first face of a substrate, comprising the following steps:

simultaneously etching at least a first and a second sub-pattern through the first face of the substrate, the etched sub-patterns being separated by at least one separating wall, the width of the first sub-pattern being greater than the width of the second sub-pattern at the first face, and the depth of the first sub-pattern being greater than the depth of the second sub-pattern in a direction perpendicular to the said first face, a step to remove or eliminate the said separating wall, to expose the desired complex pattern.

The number of different sub-patterns formed may be higher than 2.

The separating walls preferably have at least one common surface with the first face of the substrate. They can then be removed, eliminated to expose the desired complex pattern.

At least a first and a second sub-pattern can be etched through a mask, whose openings correspond to the dimensions of a first and a second sub-pattern etched in the first face of the substrate. In other words, the said sub-patterns can be formed simultaneously using a mask placed between the first face of the substrate and etching means (see below). In this manner rapid etching of the sub-patterns can be obtained.

The sub-patterns can be etched in the substrate simultaneously using anisotropic etching, preferably by dry process e.g. using plasma etching of RIE (reactive ion etching) type or by wet process such as porosification or chemical etching.

A sub-pattern or etch or trench may have a width of between a few nanometers and several micrometers, between 10 nm and 500 µm, preferably between 0.1 µm and 500 µm.

The width of an etch is defined as being the distance separating the walls of a sub-pattern at or on the first face or in a plane parallel or substantially parallel to the first face of the substrate.

The depth of a sub-pattern may be between a few nanometers and several micrometers, preferably between 0.1 µm and 500 µm.

The width may also be defined as being the smallest dimension of a sub-pattern at the first face of the substrate, the width allowing defining of the depth of etching in a direction substantially normal to the first face of the substrate.

The width of the sub-patterns may be smaller than their depth. The widest sub-patterns or etches may then be the deepest sub-patterns or trenches in the substrate, and conversely the least deep sub-patterns may be the narrowest sub-patterns. The present invention therefore allows sub-patterns to be produced having different depths, by causing the width of the sub-patterns to vary through ARDE effect (Aspect Ratio Dependent Etching). In other words, use is made of the physical phenomenon whereby the speed of etching is reduced when the width of the sub-pattern decreases, over the previously cited width ranges.

Preferably, the sub-patterns are etched using a technique promoting the ARDE phenomenon, for example plasma etching techniques. The following techniques are therefore preferred: Reactive Ion Etching or Deep Reactive Ion Etching.

The sub-patterns can be produced by anisotropic etching e.g. using a dry etching technique and preferably a plasma etching technique.

Optionally a wet etching technique could also be used alone or in combination with another etching technique.

Several sub-patterns of identical shape can form a group of sub-patterns.

Several groups of sub-patterns of different shapes can be grouped together and/or alternated and/or combined in suitable manner to obtain the desired complex pattern, these being separated by separating walls before the removal step, for example from a first and second group of sub-patterns.

The contour of one or more sub-patterns at the first face may be square-shaped and/or rectangular and/or circular and/or ovoid.

At least a first and a second etched sub-pattern can communicate with one another to form at least one continuous etch whose depth varies in a direction perpendicular to the first face.

The width of a continuous etch may vary at the first face of the substrate.

The contours of a continuous etch may have a desired geometric shape from among the preceding shapes, or they may have a spiral shape for example.

The thickness or the width of the separating walls may be between a few nanometers and several micrometers, between 0.1 and 5 µm or between 1 and 5 µm.

The thicknesses of the separating walls may be identical or close, to facilitate their homogeneous removal. In other words, the sub-patterns are preferably spaced regularly apart so that the separating walls which separate their etches are of similar or identical thickness.

The removal of the separating walls can be obtained using an isotropic etching technique. By juxtaposing trenches of different widths, hence of different depths, after the removal of the separating walls between the trenches the desired complex pattern is obtained. The depth levels of the complex pattern can therefore be determined as a function of the width of the etchings of the sub-patterns.

The sub-patterns can be produced on a substrate comprising one or more layers, optionally of different compositions. Preferably the substrates used are those used in the field of microelectronics, more particularly to obtain microsystems of MEMS (Micro-Electro-Mechanical Systems) and/or MOEMS (Micro-Opto-Electro-Mechanical Systems) type. For example they may be single- or multi-layer, each layer possibly being formed from one of the following materials; silica or/and silicon and/or germanium.

BRIEF DESCRIPTION OF THE DRAWINGS

Other details and characteristics of the invention will become apparent from the following description given in connection with the following appended Figures. Identical, similar or equivalent parts in the different Figures carry the same reference numbers to facilitate cross-reading between the Figures. The different parts illustrated in the Figures are not necessarily shown to uniform scale, for better legibility of the Figures. The reference points indicated in the Figures are orthogonal.

FIG. 2b is a SEM image (scanning electron microscope), of a profile cross-section along axis (AA') of the substrate in FIG. 2a.

DETAILED DESCRIPTION OF PARTICULAR EMBODIMENTS

The present application concerns a method for fabricating a complex pattern in a substrate.

Figure 2A:
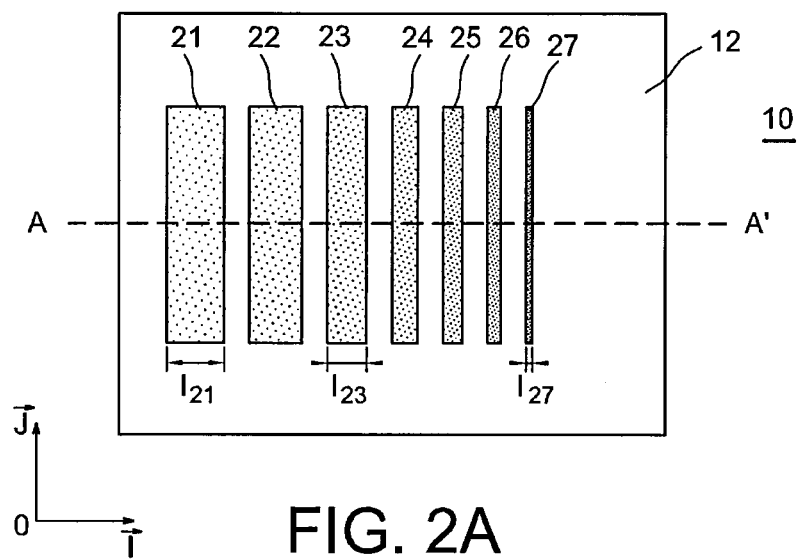
FIG. 2a gives an overhead view of a substrate comprising several parallel sub-patterns of different widths.

The substrate 10 may comprise a first face 12 in contact with the outside environment (FIG. 2a). It may have one or more layers, optionally of different compositions, preferably formed in a material which can be etched by dry or wet process. This material may be an organic or mineral substance of insulating, semiconductive or conductive type. It may be composed of one of the following materials: silicon, silica, quartz.

For example, a substrate which can be used in the present application may be a wafer commonly used in the microelectronics industry, comprising a silicon layer having a thickness of several hundred micrometers e.g. between 100 µm and 1 mm, coated with a silica layer. In this case, the first surface layer may be the silica layer having a thickness of between a few tens of nanometers and several micrometers, for example between 10 nm and 5 µm.

A complex pattern is formed according to the invention from at least two sub-patterns.

A first sub-pattern or first etch is performed through the first face 12 of the substrate 10. The removal or elimination of at least part of the material of the substrate 10 can be performed through one or more layers lying above the first face 12. The sub-pattern may optionally pass through the substrate 10. Removal is conducted along the contours of the sub-pattern on the first face 12 of the substrate 10 and using a wet, chemical or electrochemical etching technique, or preferably by dry process.

The width $I_X$ of the first sub-pattern or etch X i.e. the distance separating its walls in a plane merging with the first face 12, may be between a few nanometers and several hundred micrometers, for example between 10 nm and 1 mm.

Figure 1A:
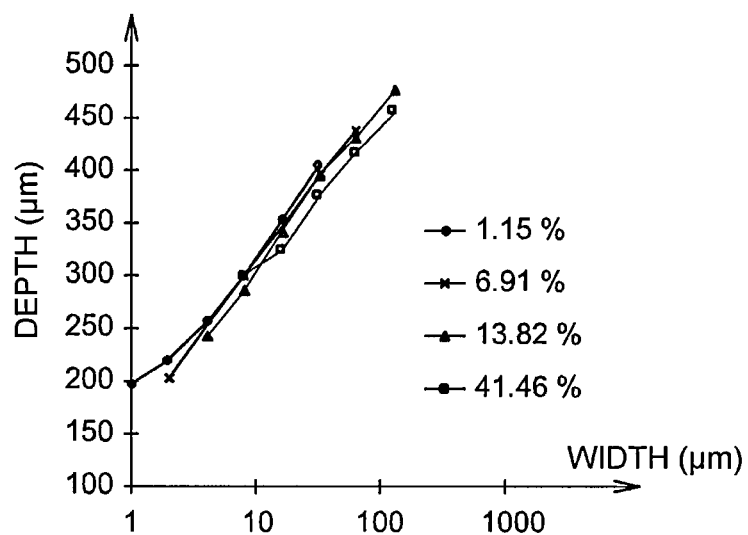
FIG. 1a illustrates the influence of the width of etching of a pattern on its depth, for an etching time of 80 minutes (Jani Karttunen et al., Loading effects in deep silicon etching, Proceedings of SPIE 2000, Vol. 4174, pp. 90-97).
Figure 1B:
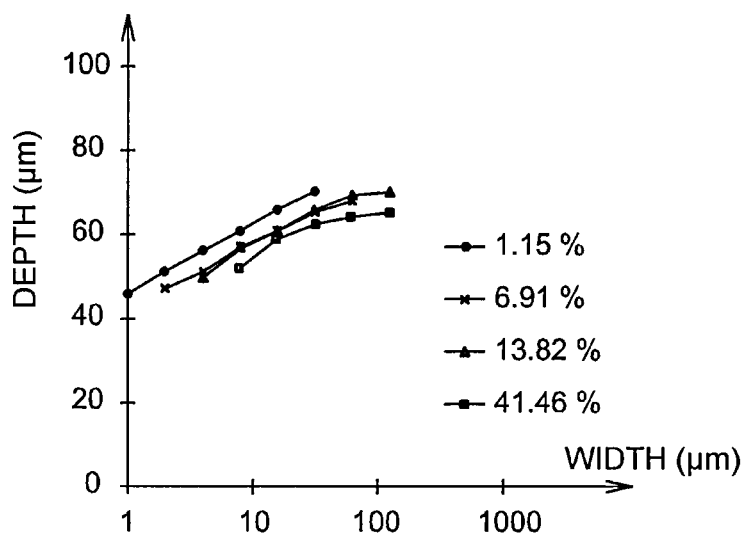
FIG. 1b illustrates the influence of the width of etching of a pattern on its depth for an etching time of 10 minutes (Jani Karttunen et al., Loading effects in deep silicon etching, Proceedings of SPIE 2000, Vol 4174, pp. 90-97).

However within this range of values it is not possible to obtain etches of same depth having different widths (Jani Karttunen et al., *Loading effects in deep silicon etching*, Proceedings of SPIE 2000, Vol. 4174, pp. 90-97). More specifically for one same etching condition, etching becomes deeper as its width increases (FIGS. 1a and 1b). This phenomenon is known under the name ARDE or aspect ratio.

To overcome this problem, it is necessary to adapt etching speed and/or time in relation to the width of each etching. On this account, the parameters of etching and/or the etching masks used are associated with a single type of pattern characterized by etchings of same width and same depth. In other words, the forming of a pattern comprising sub-patterns of same depth but of different widths requires the same number of specific etching steps as there are sub-patterns of different widths. One alternative is to form the sub-patterns in a substrate comprising an etch stop layer such as indicated in the preceding reference (C. Gui et al.). This is why the phenomenon of aspect ratio is considered to be a major drawback, a parasitic phenomenon, when it is desired to form patterns of same depth but of different widths in one same substrate.

The inventor has surprisingly been able to use this parasitic phenomenon to develop a novel method for producing a complex pattern, in a substrate not comprising any etch stop layer.

The width of the first sub-pattern according to the invention is therefore deliberately placed in the range of values in which the aspect ratio phenomenon occurs, preferably between 0.1 µm and 500 µm. Therefore the depth $P_X$ of etch X is dependent on its width $I_X$.

The depth $P_X$ of a sub-pattern may vary between a few nanometers and several hundred micrometers, for example between 10 nm and 1 mm.

Preferably, to form the first sub-pattern, etching techniques are used which have strong anisotropy i.e. high verticality promoting the aspect ratio phenomenon. These techniques are reactive ion etching (RIE) for example or deep reactive ion etching (DRIE).

One or more masks, placed between the means allowing etching of the substrate and the said substrate, or else against the first face 12 of the substrate can allow forming of the first sub-pattern. A mask is used to protect the regions of the first face 12 that it is desired to preserve during the etching process. The use of one or more masks is more particularly adapted for etching techniques having greater efficacy in a given direction.

According to a first example of embodiment of the invention, more than two sub-patterns of different widths are formed through the first face 12 of a substrate 10 (FIG. 2a). The depth of the etches or trenches in the substrate 10 is dependent on their width in accordance with the sensitive ARDE or aspect ratio phenomenon (FIG. 2b).

The removal of material is preferably performed in a direction perpendicular to the face 12. Therefore the widths of the separating walls $PS_X$ between the sub-patterns (along vector $\vec{T}$) are identical or similar to facilitate their subsequent removal.

Optionally the walls may lie at a different angle relative to the face 12, but advantageously and preferably they are parallel or substantially parallel to one another for the aforementioned reason.

The elimination or removal of the separating walls can be performed by isotropic etching, via wet chemical etching or via dry plasma etching, or by oxidation and selective etching of the formed oxide when etchings are made in single-crystalline or polycrystalline silicon. In the present case the separating walls $PS_{21-26}$ are removed by chemical etching.

Figure 2C:
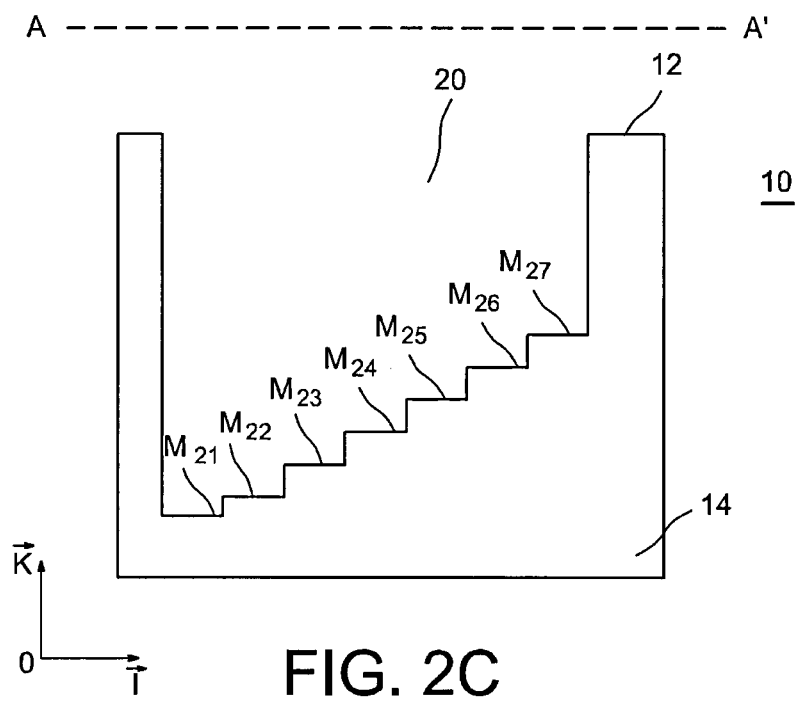
FIG. 2c shows the substrate in FIG. 2b after removal of the walls separating the sub-patterns.
Figure 2B:
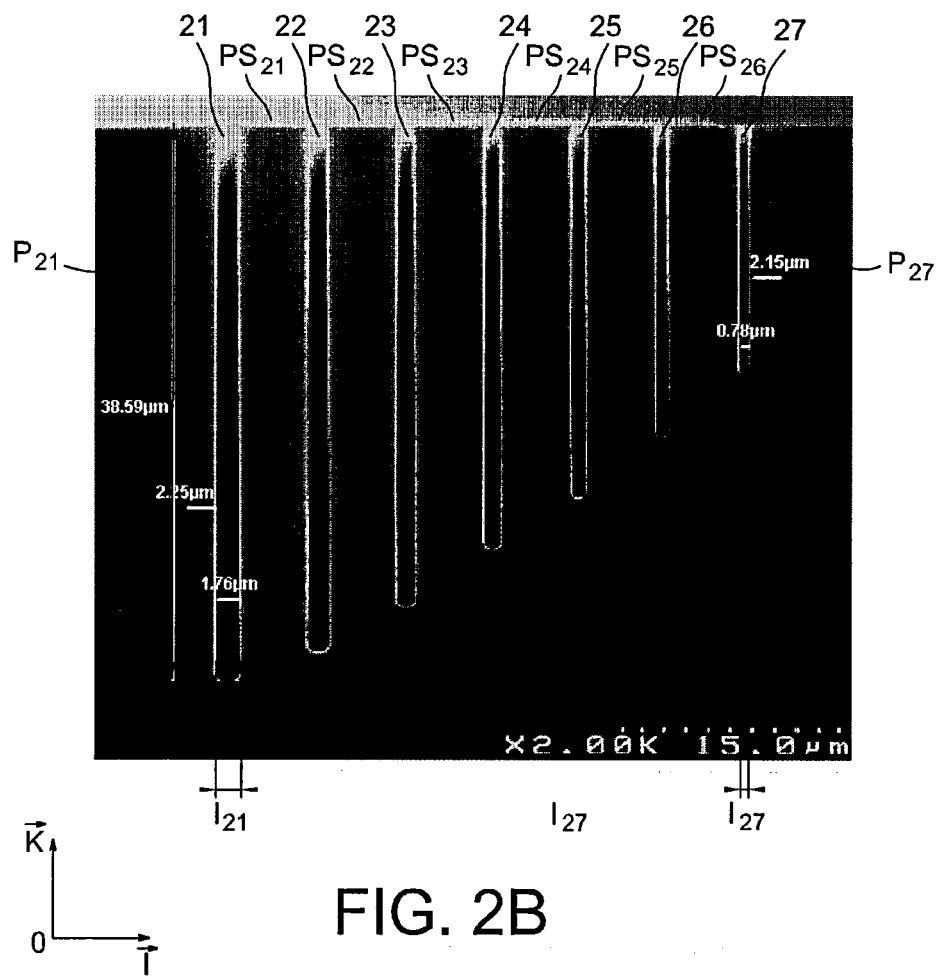

The removal of the separating walls delimiting the sub-patterns 21 to 27 allows exposure of the desired complex pattern 20 (FIG. 2c). The bottom of the pattern is delimited by steps $M_{21}$ to $M_{27}$ whose depth corresponds to the widths $I_{21-27}$ of the preceding etches 21 to 27. It is advantageous that these walls should be of minimum width, the fineness of the pattern profile being dependent thereupon.

When the walls are removed by isotropic etching i.e. the etching speed is identical in all directions, the bottoms of the sub-patterns are also etched. This is the reason why the separating walls are preferably as thin as possible, to limit this phenomenon and better control the profile of the desired complex pattern. In other words, the width of the separating walls is chosen to be as narrow as possible in accordance with the anisotropic characteristics of the etching, so that their rapid removal is later possible thereby limiting the influence of this removal step on the final profile of the complex pattern. According to one example, and in particular if silicon is used and deep reactive ion etching (DRIE), the width of the separating walls may be between 0.1 and 5 µm or between 1 and 5 µm, for deep etches of several hundred micrometers.

Optionally and in particular if a silicon substrate is used, a step to smooth the bottom of the complex pattern can be carried out by greater or lesser oxidation, with removal by selective etching of this oxide layer.

The invention therefore allows the forming of a complex pattern 20 whose profile in a plane perpendicular to the first face 12 is controlled.

Several variants of the aforementioned fabrication method are presented below.

Figure 3A:
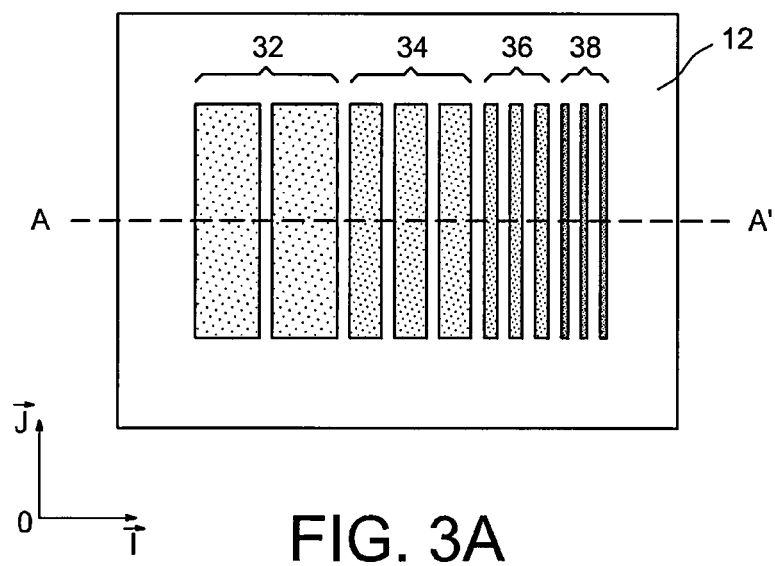
FIG. 3a is an overhead view of a substrate comprising several parallel sub-patterns of different widths.
Figure 3B:
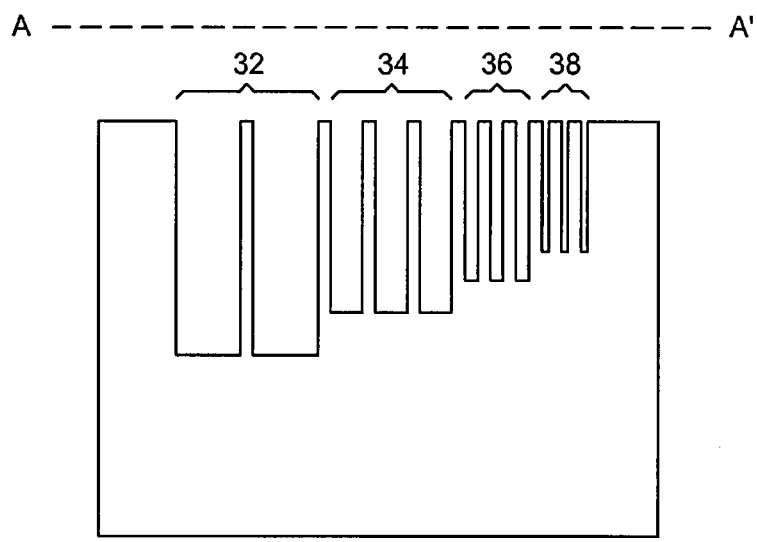
FIG. 3b gives a profile view of a cross-section of the substrate in FIG. 3a, along axis (AA').

Groups of adjacent sub-patterns 32, 34, 36, 38 having etches of same width and parallel with one another are arranged and/or grouped together so as to form the desired complex pattern (FIGS. 3a and 3b).

Figure 4A:
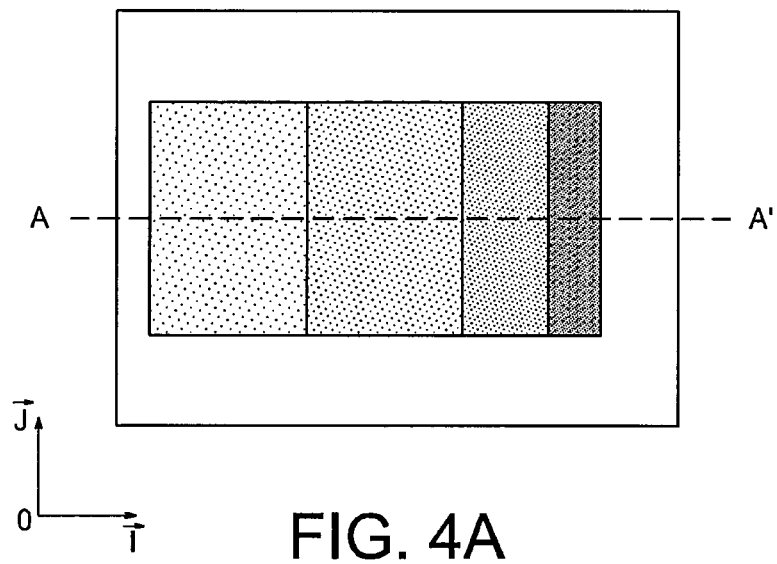
FIG. 4a is an overhead view of the substrate in FIG. 3a, after removal of the walls separating the sub-patterns.
Figure 4B:
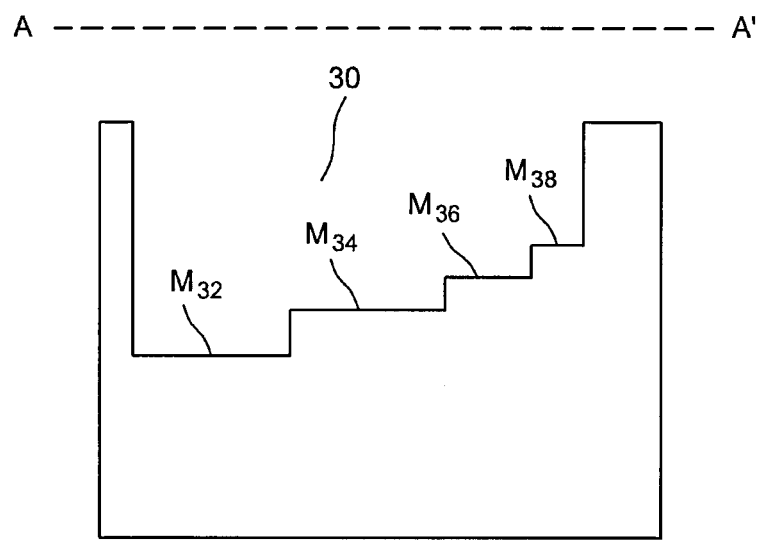
FIG. 4b is a profile view of a cross-section of the substrate in FIG. 3b along axis (AA'), after removal of the walls separating the sub-patterns.

The removal of the walls separating the sub-patterns allows exposing of the steps $M_{32}$, $M_{34}$, $M_{36}$, $M_{38}$ of different width and depth. It is hence possible to form a complex pattern 30 of desired widths and depths in the substrate 10 (FIGS. 4a and 4b). In other words the width of the complex pattern 30 is dependent on the number of sub-patterns, and its depth is defined by the width of the said sub-patterns. By acting on these two parameters, it is then possible to form complex patterns in a substrate of the type usually used in the field of microelectronics, without the formed complex pattern being dependent on the structure of the substrate, and in particular on the position of an etch stop layer contained in the said substrate.

Figure 5A:
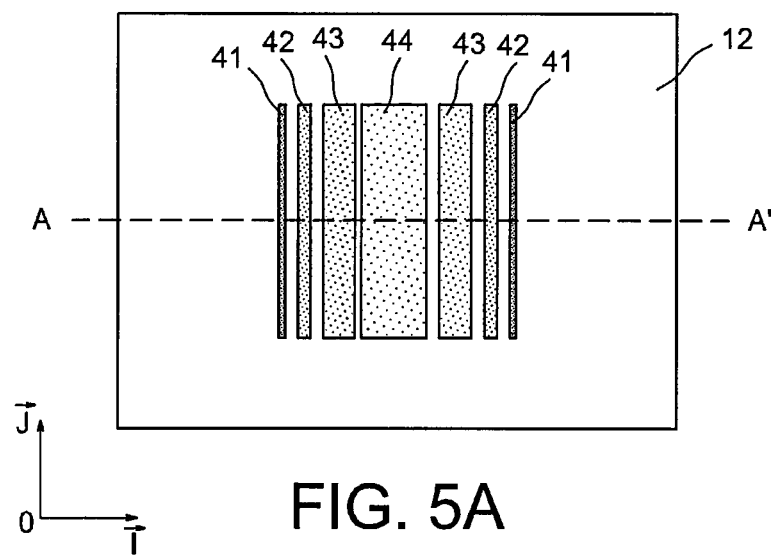
FIG. 5a is an overhead view of a substrate comprising several parallel sub-patterns, the width of the sub-patterns increasing from the periphery of the group of sub-patterns towards its centre.
Figure 5B:
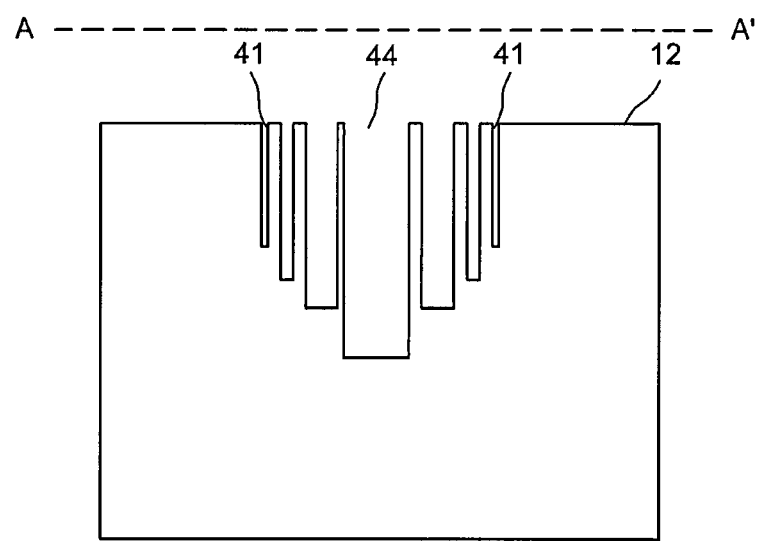
FIG. 5b is a profile view of a cross-section of the substrate in FIG. 5a along axis (AA').
Figure 5C:
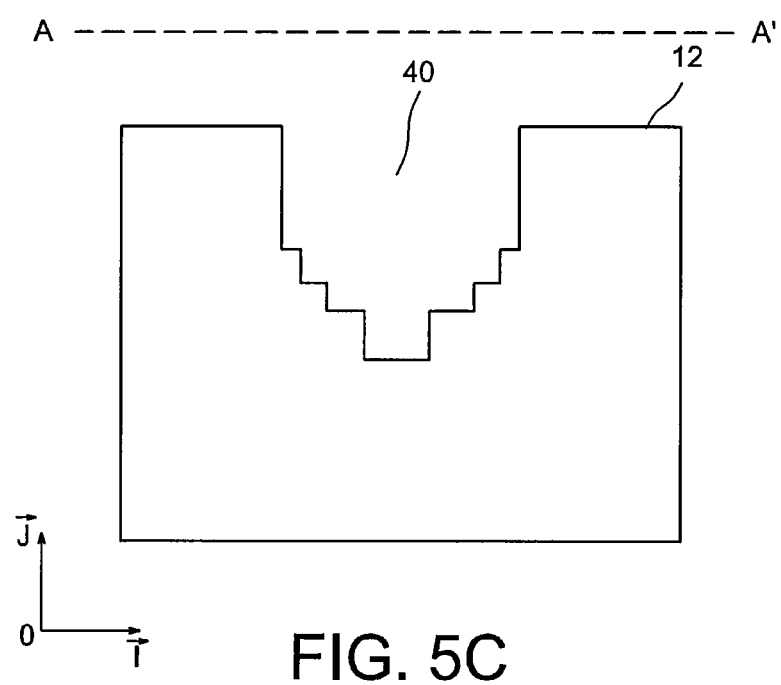
FIG. 5c illustrates the substrate in FIG. 5b, after removal of the walls separating the sub-patterns.

For example, the width of the sub-patterns may increase between the peripheral etches and the central etches (FIGS. 5a and 5b). In this manner, after removal of the separating walls, a complex pattern 40 can be formed having a pointed profile in a plane perpendicular to the face 12 of the substrate 10 (FIG. 5c).

Figure 6A:
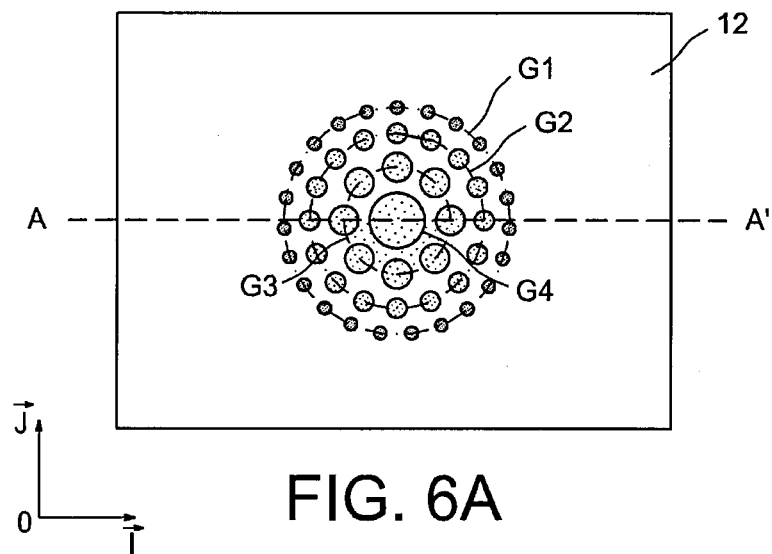
FIGS. 6a-6d are overhead views of a substrate comprising several parallel sub-patterns of different widths.
Figure 6B:
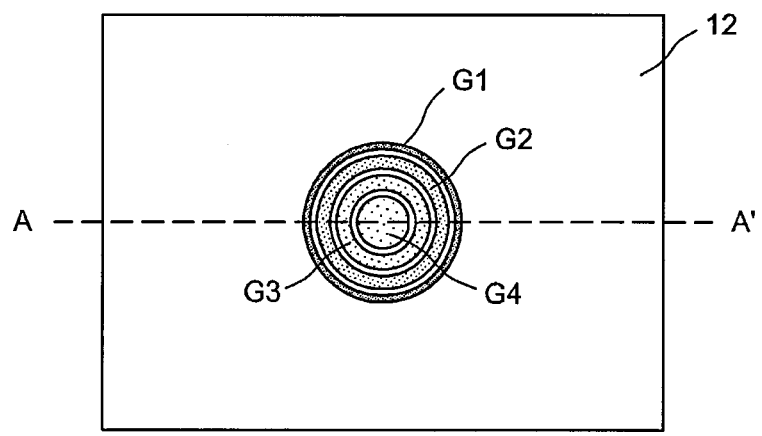
Figure 6C:
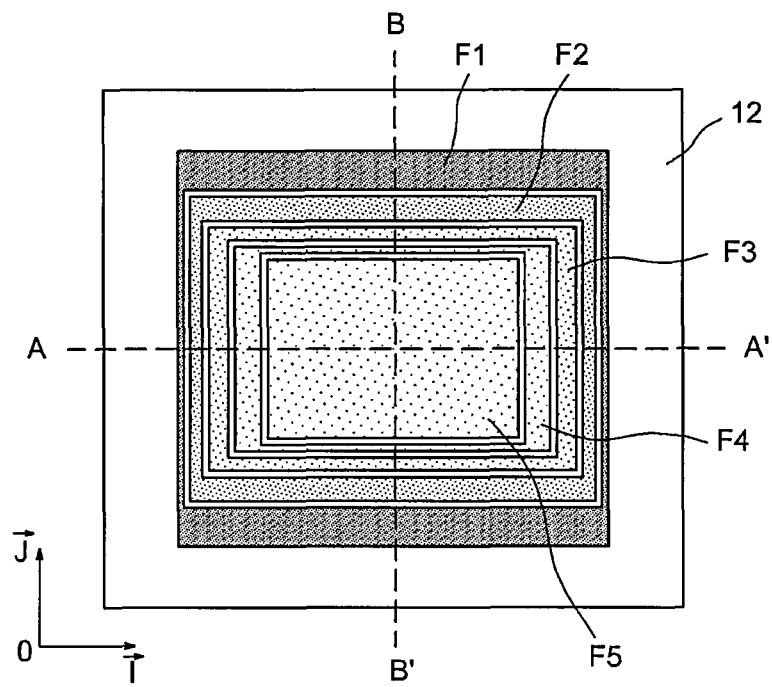
Figure 6D:
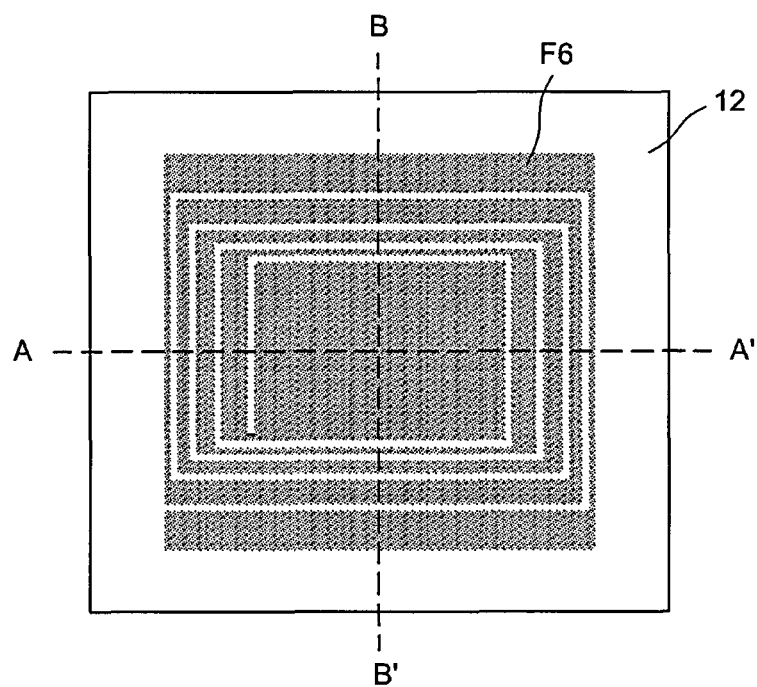
Figure 6E:
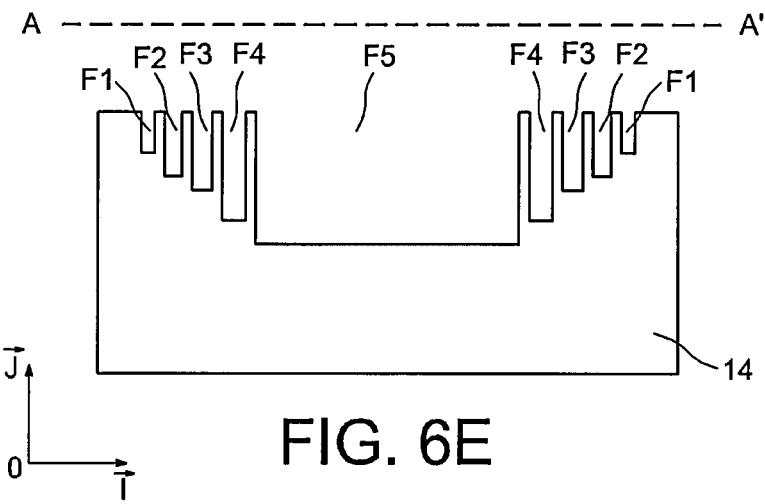
FIG. 6e is a profile view of a cross-section of the substrate in FIGS. 6a to 6d along axis (AA').
Figure 6F:
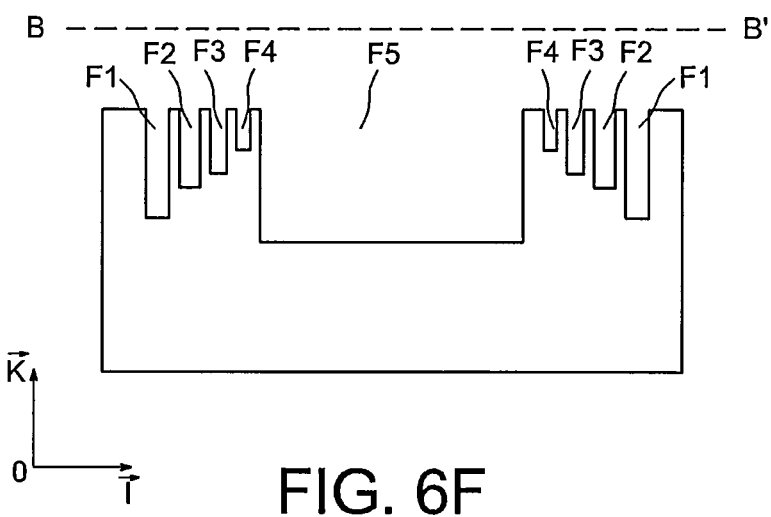
FIG. 6f is a profile view of a cross-section of the substrate in FIGS. 6c and 6d along axis (BB').
Figure 6G:
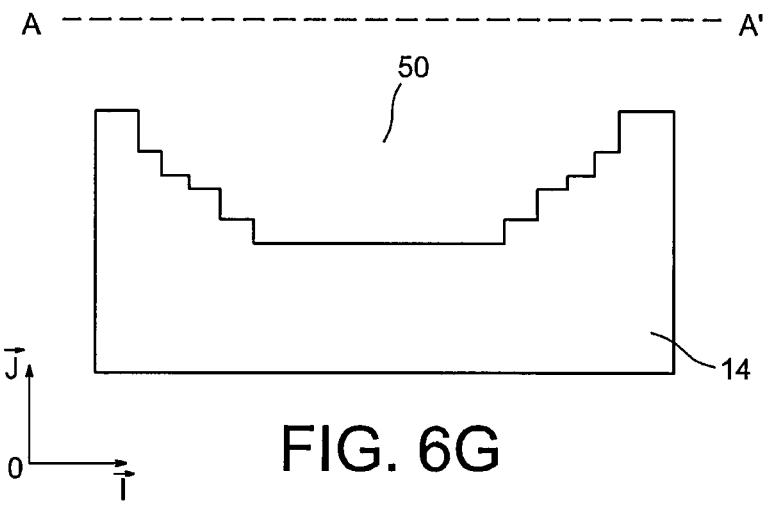
FIG. 6g shows the substrate in FIG. 6e after removal of the walls separating the sub-patterns.

To form a complex pattern 50 such as illustrated in FIG. 6g, sets of sub-patterns G1 to G4 can be produced for example (FIGS. 6a and 6b). A set of sub-patterns can be composed of several etches of circular shape forming a discontinuous circle (FIG. 6a), or else the sub-patterns can communicate together to form a continuous etch of circular shape (FIG. 6b). In other words, the separating walls between the etches forming a set of sub-patterns of circular shape, can be removed to obtain a continuous etch of same shape. In both cases, the sets of sub-patterns G1 to G4 are preferably separated by separating walls of constant width.

Figure 6H:
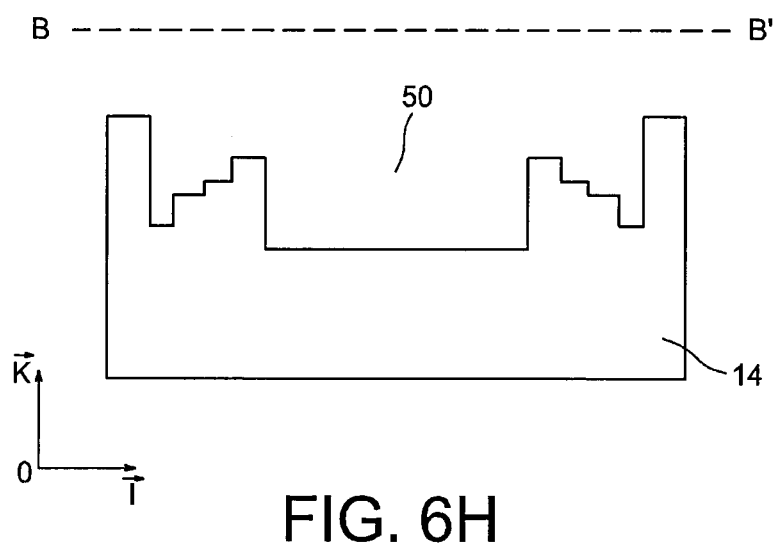
FIG. 6h shows the substrate in FIG. 6f after removal of the walls separating the sub-patterns.

According to one alternative for forming a complex pattern 50 such as illustrated in FIGS. 6g and 6h, several sub-patterns F1 to F5 at the first face 12 of the substrate 10 may form several intertwined frames (FIG. 6c). The width of these frames or etches may vary differently along two orthogonal axes (AA') and (BB'). Therefore the profile of the etches in the substrate 10 is not the same in relation to these two axes (FIGS. 6e and 6f). After removal of the walls separating the sub-patterns, a complex pattern 50 is obtained having a profile which differs along the said axes (FIGS. 6g and 6h).

The aforementioned complex pattern can also be obtained from several sub-patterns of rectangular contour, joined together at their ends so as to form a continuous etch whose contour is of helical shape at the first face 12 (FIG. 6*d*). After removal of the walls separating the etches, the aforementioned complex pattern 50 is obtained (FIGS. 6*g* and 6*h*).

The foregoing examples are not limiting; for example the sub-patterns formed at one same face of a substrate may have different contours and/or arrangements.

The inventors have surprisingly been able to take advantage of a physical phenomenon i.e. the aspect ratio considered up until now to be a parasitic phenomenon, to develop novel methods for forming complex patterns independently of the structure of the substrate.

The above novel methods therefore overcome the problematic, complicated steps of fabricating a substrate to be etched with a complex pattern. By eliminating these technical difficulties the method becomes simplified and hence quicker to carry out.

One of the advantages of the invention is that it is less complex to implement than in the prior art, using etching techniques currently used in the field of microelectronics. The phenomenon of aspect ratio occurs on microscopic scale, and the invention is thereby more easily and quickly adapted to most etching techniques applied in this field.

The invention claimed is:

1. A method for etching a desired complex pattern in a first face of a substrate, comprising:
   simultaneous etching of at least a first and a second sub-pattern through the first face of the substrate, the etched sub-patterns being separated by at least one separating wall, a width of the first sub-pattern being greater than a width of the second sub-pattern at the first face, and a depth of the first sub-pattern being greater than a depth of the second sub-pattern in a direction perpendicular to the first face; and
   removing or eliminating the separating wall to form the desired complex pattern.

2. The method for etching a complex pattern according to claim 1, at least the first and the second sub-pattern being etched through a mask whose openings correspond to dimensions of the first and the second sub-pattern formed in the first face of the substrate.

3. The method for etching a complex pattern according to claim 1, the width of the sub-patterns at the first face of the substrate being between a few nanometers and several micrometers, or between 0.1 μm and 500 μm.

4. The method for etching a complex pattern according to claim 1, the depth of the sub-patterns being between a few nanometers and several micrometers, or between 0.1 μm and 500 μm.

5. The method for etching a complex pattern according to claim 1, wherein plural groups of sub-patterns of different shapes can be grouped together and/or alternated and/or combined to obtain the desired complex pattern, the plural groups being separated by separating walls before the removing, or separated from a first and second group of sub-patterns.

6. The method for etching a complex pattern according to claim 5, a thickness of the separating walls in a plane parallel or substantially parallel to the first face being identical or similar to facilitate removal of the walls.

7. The method for etching a complex pattern according to claim 5, the separating walls being parallel to one another.

8. The method for etching a complex pattern according to claim 1, a contour of the sub-patterns at the first face being of square and/or rectangular and/or circular and/or ovoid shape.

9. The method for etching a complex pattern according to claim 1, wherein at least the first and the second etched sub-pattern communicate together to form at least one etch whose depth varies in a direction perpendicular to the first face.

10. The method for etching a complex pattern according to claim 1, wherein at least the first and the second etched sub-pattern communicate together to form a continuous etch whose width varies at the first face.

11. The method for etching a complex pattern according to claim 10, the continuous etch forming a spiral.

12. The method for etching a complex pattern according to claim 1, a thickness of the separating wall in a plane parallel or substantially parallel to the first face being between a few nanometers and a few micrometers, or between 0.1 and 5 μm.

13. The method for etching a complex pattern according to claim 1, the etching of the sub-patterns being performed by anisotropic etching.

14. The method for etching a complex pattern according to claim 13, the etching being performed by dry process.

15. The method for etching a complex pattern according to claim 1, the removing the separating wall being performed by isotropic etching.

16. The method for etching a complex pattern according to claim 1, the substrate being single- or multi-layer, each layer being formed from one of the following materials: silica and/or silicon and/or germanium.

\* \* \* \* \*